United States Patent
Jung

(10) Patent No.: US 7,696,039 B2
(45) Date of Patent: Apr. 13, 2010

(54) METHOD OF FABRICATING SEMICONDUCTOR DEVICE EMPLOYING SELECTIVITY POLY DEPOSITION

(75) Inventor: Myung Jin Jung, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 316 days.

(21) Appl. No.: 11/809,734

(22) Filed: May 31, 2007

(65) Prior Publication Data
US 2007/0238277 A1   Oct. 11, 2007

Related U.S. Application Data

(62) Division of application No. 11/026,312, filed on Dec. 28, 2004, now Pat. No. 7,253,472.

(30) Foreign Application Priority Data
Dec. 30, 2003   (KR) ...................... 10-2003-0100543

(51) Int. Cl.
*H01L 21/8238* (2006.01)
*H01L 21/336* (2006.01)
(52) U.S. Cl. ................ 438/231; 438/305; 257/E21.335
(58) Field of Classification Search ................ 438/231, 438/301, 302, 305; 257/E21.335, E21.438
See application file for complete search history.

(56) References Cited

U.S. PATENT DOCUMENTS

| | | | |
|---|---|---|---|
| 4,610,078 A | 9/1986 | Matsukawa et al. | |
| 5,006,911 A | 4/1991 | Sivan | |
| 6,017,823 A | 1/2000 | Shishiguchi et al. | |
| 6,080,661 A | 6/2000 | Bothra | |
| 6,858,487 B2 | 2/2005 | Yang et al. | |
| 2004/0126968 A1* | 7/2004 | Kito | ........................... 438/257 |

FOREIGN PATENT DOCUMENTS

JP   10-242464   9/1998

OTHER PUBLICATIONS

Teru Mineji and Tomoko Yasunaga; Manufacture or Semiconductor Device; Patent Abstracts of Japan; Publication No. 10-242464; Publication Date Sep. 9, 1998; 2 Pgs.; Japan Patent Office, Japan.

(Continued)

*Primary Examiner*—Walter L Lindsay, Jr.
(74) *Attorney, Agent, or Firm*—The Law Offices of Andrew D. Fortney; Andrew D. Fortney; Theresa J. Mahan

(57) ABSTRACT

A method for fabricating a semiconductor device employing a selectivity poly deposition is disclosed. The disclosed method comprises depositing selectivity poly on a gate poly and source/drain regions of the silicon substrate, and forming salicide regions on the gate and active regions from the deposited selectivity poly. Accordingly, the present invention employing selectivity poly deposition can reduce or minimize contact surface resistance and improve the electrical characteristics of the semiconductor device by reducing the surface resistance in a miniature semiconductor device. In addition, because the size of the gate electrode is getting small, the present invention can be used as an essential part of the future generations of nano-scale technology. Moreover, mass semiconductor production systems can promptly employ the present invention with existing equipment.

20 Claims, 4 Drawing Sheets

OTHER PUBLICATIONS

Laura Peters; Selective Epitaxy Falls into Favor; Semiconductor International, Nov. 1, 2004; 4 Pgs.; Reed Business Information, Reed Elsevier Inc.

Stanley Wolf, Ph.D. and Richard N. Tauber, Ph.D.; Silicon Processing for the VLSI Era; vol. 1: Process Technology, Second Edition; pp. 245-247 & 324-331; Copyright 2000; Lattice Press, Sunset Beach, CA.

James D. Plummer, Michael Deal and Peter B. Griffin; Fundamentals, Practice and Modeling; Silicon VLSI Technology; Etching; pp. 609-618; Copyright 2000; Prentice Hall, Upper Saddle River, NJ.

* cited by examiner

METHOD OF FABRICATING SEMICONDUCTOR DEVICE EMPLOYING SELECTIVITY POLY DEPOSITION

This application is a divisional of U.S. patent application Ser. No. 11/026,312 filed Dec. 28, 2004 now U.S. Pat. No. 7,253,472.

BACKGROUND OF THE INVENTION

1. Field of the Invention

The present disclosure relates to a method of fabricating a semiconductor device employing selectivity poly deposition. More particularly, the present disclosure relates to a method of fabricating a high-integration semiconductor device that may reduce or minimize contact surface resistance resulting from a salicide process by employing selectivity poly deposition in forming a CMOS transistor in the semiconductor device.

2. Background of the Related Art

Referring to FIG. 1 and FIG. 2, a conventional method of fabricating a semiconductor device is illustrated. FIG. 1 shows a flow chart of one conventional method of fabricating a semiconductor device. FIG. 2 schematically illustrates, in a cross-sectional view, a semiconductor device according to the conventional method of fabricating a semiconductor device outlined in FIG. 1.

In accordance with the conventional method of fabricating a semiconductor device, a Shallow Trench Isolation structure (hereinafter referred to as "STI") 11 is formed over a semiconductor substrate.

A gate oxide layer is grown on the substrate in regions other than the location of the STI 11 (S102), and a polysilicon layer is deposited (S103) on the gate oxide layer. Thereafter, a patterning process is performed (S104) to form a gate poly 2 over a gate oxide 1. A low concentration of dopant ions are implanted into the silicon substrate (S105) to form lightly doped source/drain regions, as is known in the art.

Spacers 3 are formed on the sidewalls of the gate poly (S106). In addition, a high concentration of dopant ions for forming the source/drain regions are implanted (S107).

However, in the above-mentioned conventional process for fabricating a semiconductor device, one of the largest problems in a logic and analog device is the increased surface resistance of poly salicide. When the semiconductor device is minimized in order to form a high-integration circuit, and as the high-integration circuit requires a great miniaturization for gate electrodes and source/drain regions, a problem arises that the surface resistance of the gate poly increases due to the decrease of the semiconductor device in size.

U.S. Pat. No. 4,610,078, Matsukawa et al., discloses a method of manufacturing a semiconductor device in which the margin for the semiconductor wafer at the step of forming the contact hole is reduced, thereby increasing the packing density of elements in semiconductor wafer.

U.S. Pat. No. 5,006,911, Richard D. Sivan, discloses a transistor device having a gate centered in an active region in which the gate does not extend beyond the active region.

U.S. Pat. No. 6,080,661, Subhas Bothra, discloses methods for making reliable conductive vias in semiconductor devices that are fabricated over a semiconductor wafer by fabricating conductive contacts down to diffusion regions and transistor gates in self-aligned contact processes.

SUMMARY OF THE INVENTION

Accordingly, the present invention is directed to a method of fabricating a semiconductor device employing selectivity poly deposition that substantially obviates one or more problems due to limitations and disadvantages of the related art.

An object of the present invention is to provide a method of fabricating a semiconductor device with reduced surface resistance (Rs) by widening salicide regions in gate electrodes and active regions and, therefore, improving the electronic characteristics of the device for ensuring process margin in high-integration circuits. Concretely, the object of the present invention is to improve the characteristics of a semiconductor device and embody a high-integration circuit by ensuring a relatively wide area for the gate electrode region and reducing the surface resistance of the salicide regions (in accordance with the technological trend toward shortening gate length) by depositing selectivity poly (e.g., selective epitaxial silicon) on the gate poly sidewall spacers. The so-deposited selectivity poly does not contribute to the surface resistance of the gate electrode.

Another object of the present invention is to provide a method of fabricating a semiconductor device in order to reduce contact resistance by widening the salicide even in source/drain regions (that is, active regions of the transistor).

To achieve these objects and other advantages and in accordance with the purpose of the invention, as embodied and broadly described herein, a method of fabricating a semiconductor device employing selectivity poly deposition, may comprise the steps of: depositing selectivity poly on a gate poly over the silicon substrate and (optionally) on source/drain regions in the silicon substrate to reduce the surface resistance in a gate electrode and active regions, and forming salicide regions on the gate and active regions from the deposited selectivity poly.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
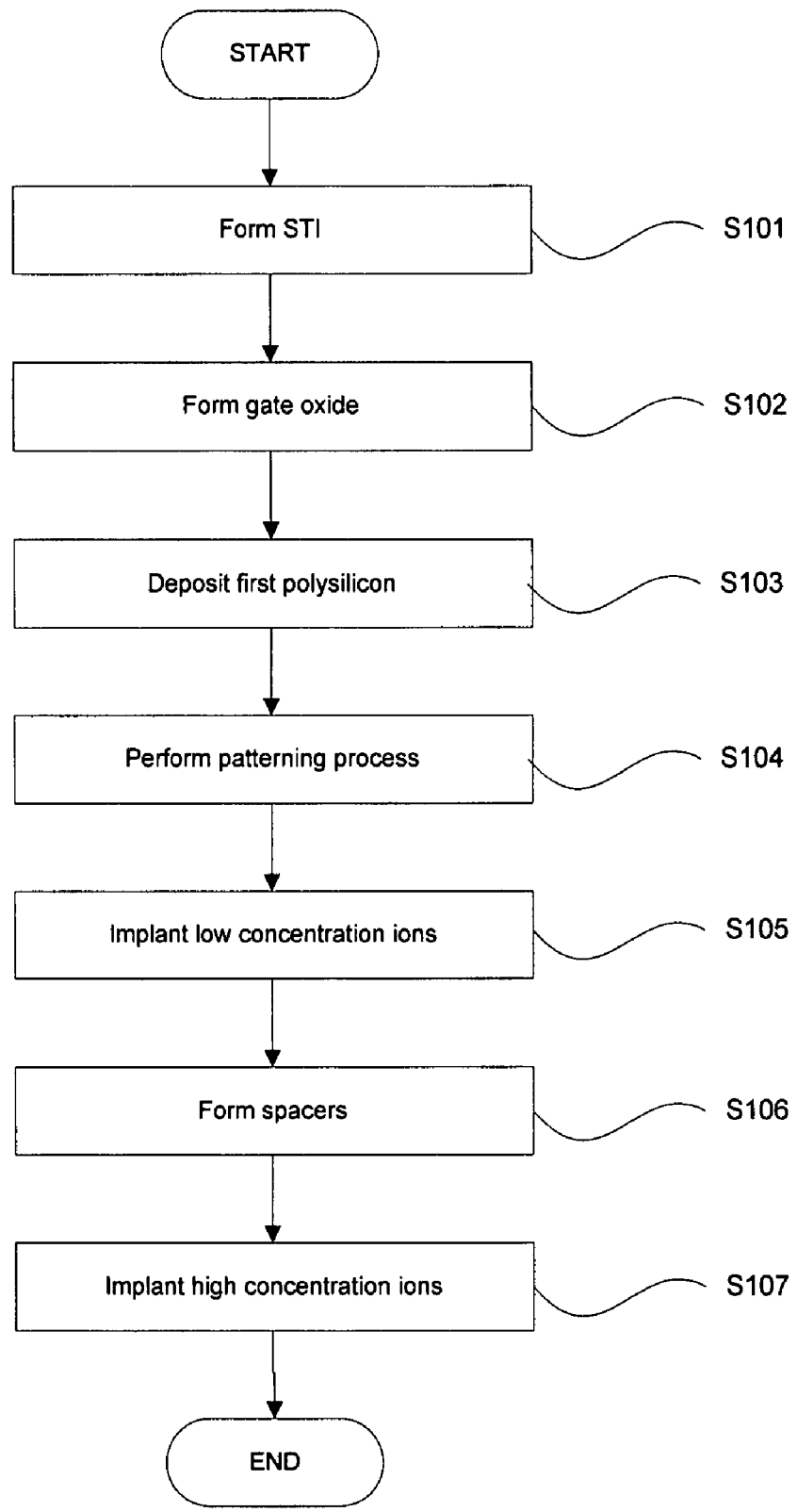
FIG. 1 illustrates, in a flow chart, a conventional method of fabricating a semiconductor device.
Figure 2:
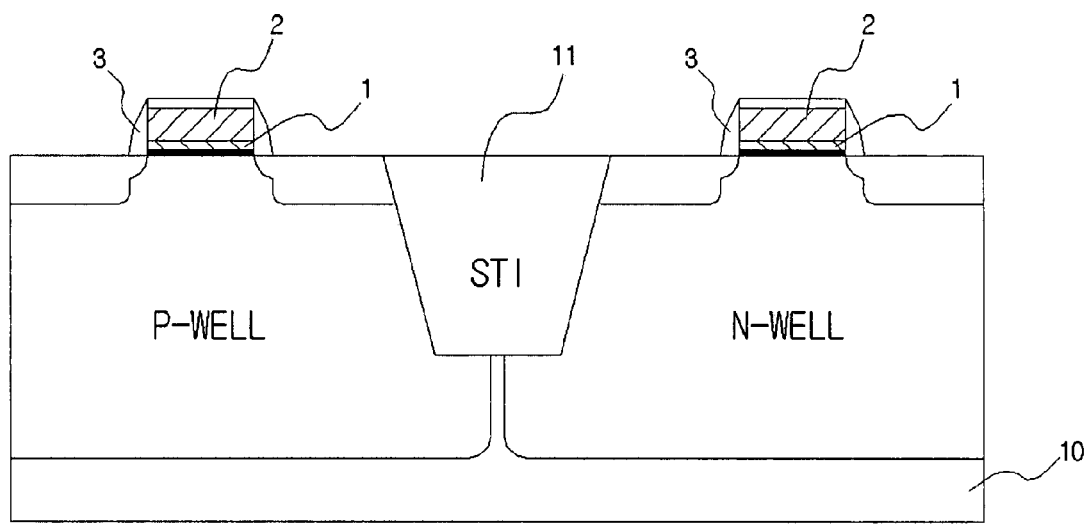
FIG. 2 schematically illustrates, in a cross-sectional view, the method of fabricating a semiconductor device according to the conventional method.
Figure 3:
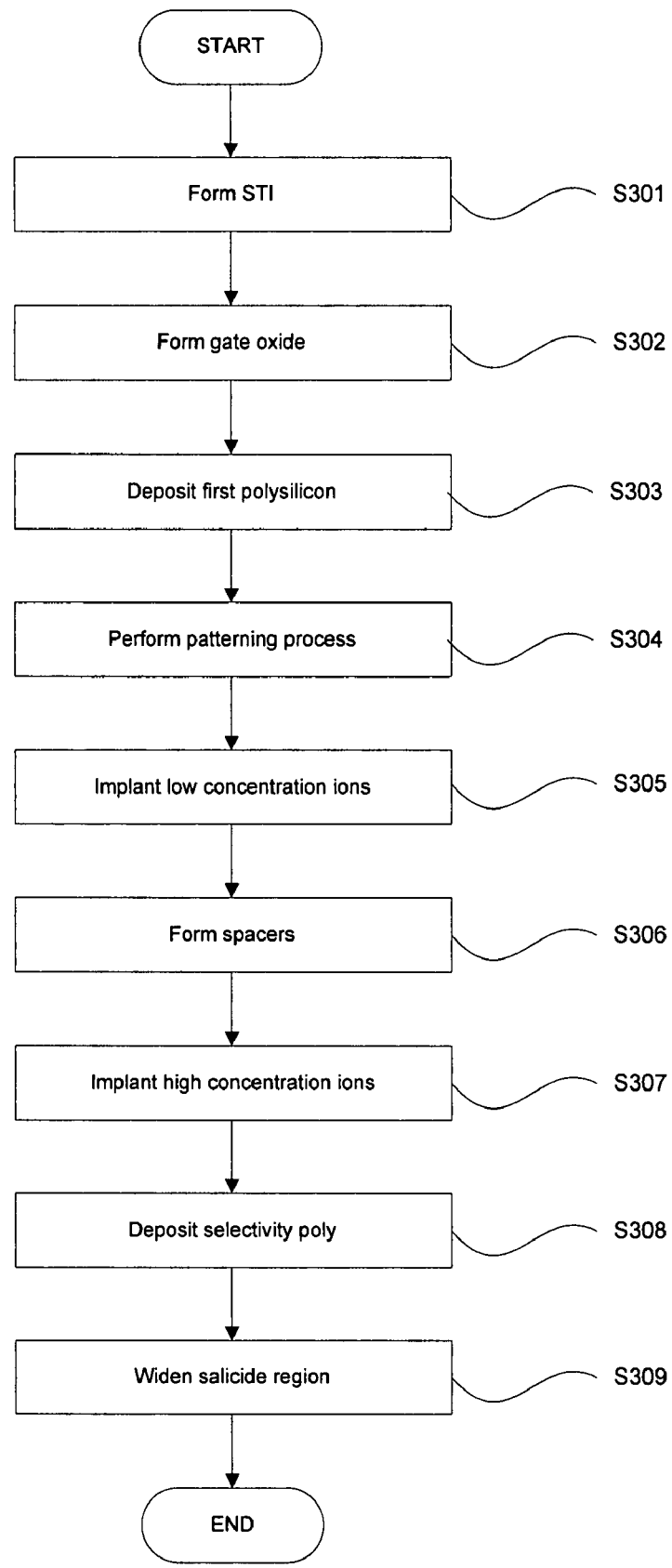
FIG. 3 illustrates, in a flow chart, the method of fabricating a semiconductor device employing selectivity poly deposition according to a preferred embodiment of the present invention.
Figure 4:
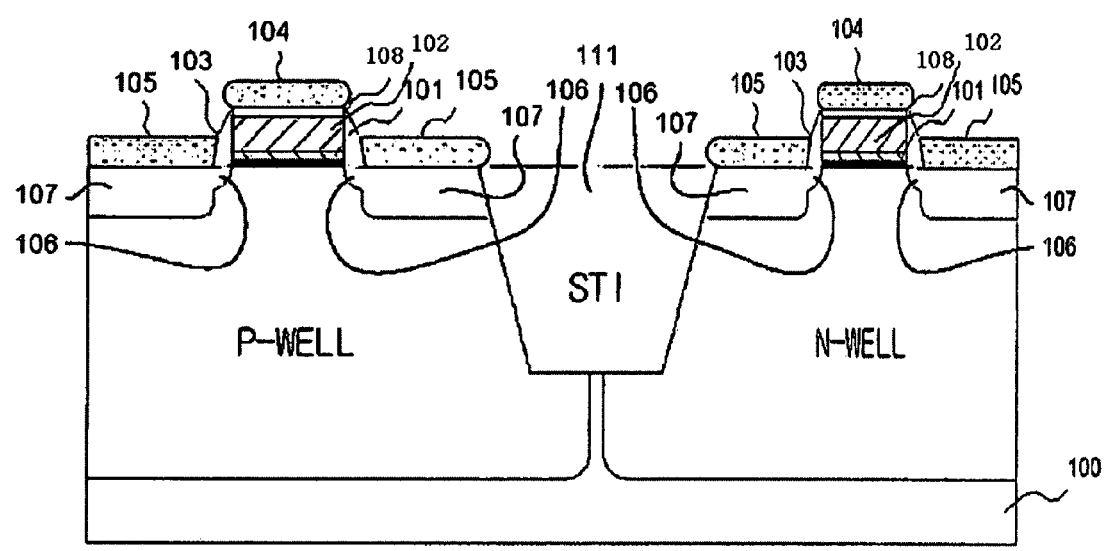
FIG. 4 schematically illustrates, in a cross-sectional view, a semiconductor device according to a preferred embodiment of the present invention.

Referring to FIG. 3 and FIG. 4, the method of fabricating a semiconductor device employing selectivity poly deposition according to a preferred embodiment of the present invention is illustrated.

FIG. 3 is a flow chart illustrating an embodiment of the method of fabricating a semiconductor device according to the present invention. FIG. 4 schematically illustrates, in a cross-sectional view, a semiconductor device according to a preferred embodiment of the present invention.

In one preferred embodiment of the present method of fabricating a semiconductor device employing selectivity poly deposition, a STI 111 is formed on, in or over a silicon substrate 100 (S301). A gate oxide layer is grown on, over or from the substrate 100 (S302), and a first polysilicon layer is deposited on the gate oxide layer. Then, a patterning process is performed to form a gate poly 102 on a gate oxide 101. Generally, this gate electrode patterning process involves etching both the gate poly layer and the gate oxide layer. Dopant ions are implanted at a low concentration into the silicon substrate 100 (S305) to form lightly doped source/drain extension regions 106.

Sidewall spacers 103 are formed on the sidewalls of the gate poly 102 and gate oxide 101 (S306). In addition, dopant ions are implanted at a high concentration into the silicon substrate 100 (S307) to form source/drain regions 107.

Thereafter, a selectivity poly 108 is deposited on exposed silicon surfaces on and/or over the silicon substrate 10 in order to improve the surface resistance which occurs in the gate electrode and active regions as a result of the conventional process (S308). Generally, the selectivity poly 108 is deposited by selective epitaxial growth (SEG) of silicon, as is known in the art. Here, consistent with conventional SEG polysilicon, the selectivity poly 108 is deposited more widely than the gate electrode and active regions. The selectivity poly 108 deposited on the gate electrode region covers a portion of the spacers 103 adjacent to the gate poly 102. However, a second polysilicon layer having a width greater than that of the polysilicon gate layer may alternatively be formed by conventional blanket deposition, photolithography and patterning. The selectivity poly 108 may also be deposited on the active regions 107, from the spacers 103 to (and, consistent with SEG polysilicon, over a nearest portion of) the STI 111. However, if selectivity poly 108 is not desired to be deposited on the active regions 107, one may keep the gate oxide layer over the active regions 107 during selectivity poly deposition (i.e., by not etching it during the gate electrode patterning steps), then remove the gate oxide over the active regions 107 (e.g., by selective anisotropic etching) after the selectivity poly 108 has been deposited on the gate poly layer 102.

Accordingly, the salicide regions 104 and 105 are enlarged by widening the gate electrode and (optionally) the active regions according to the deposited selectivity poly. The salicide is preferably made by depositing either Ti or Co on the selectivity poly, then annealing to form the corresponding metal silicide, removing unsilicided metal by selective etching, and depositing (and patterning) a conductive barrier layer (e.g., a refractory metal nitride such as TiN, which may have an adhesive or glue layer such as Ti between it and the metal silicide). An insulator material may be deposited over the entire CMOS transistor structure prior to depositing the conductive barrier layer.

As shown in FIG. 4, high yield and the stability of the process can be achieved by enlarging the margin of the salicide region. A large scale integrated circuit can be fabricated by enlarging the margin of the salicide region as well.

Accordingly, the present invention reduce or minimize contact surface resistance caused during a salicide process by employing selectivity poly deposition in forming a transistor of a high-integration CMOS semiconductor device. In addition, because the size of the gate electrode is getting smaller, the present invention can be used as an essential part of future technology, such as 90 nm, 65 nm, or 45 nm technologies, etc.). Moreover, currently existing semiconductor mass production systems (such as 0.13 µm technology) can promptly employ the present invention without facility modification.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a semiconductor device, comprising:
    a) depositing a selectivity poly on a gate poly layer and source/drain regions on a silicon substrate, wherein the selectivity poly on the gate poly layer has a width greater than that of the gate poly layer, and the selectivity poly on the source/drain regions has a width greater than that of the corresponding source/drain region; and
    b) forming salicide regions on the gate poly layer and source/drain regions from the deposited selectivity poly.

2. The method as defined in claim 1, wherein said salicide regions reduce a surface resistance of (i) a gate electrode comprising the gate poly layer and (ii) the source/drain regions.

3. The method as defined in claim 1, farther comprising, prior to depositing the selectivity poly, forming spacers on sidewalls of the gate poly layer, and implanting ions at a high concentration into the silicon substrate to form the source/drain regions.

4. The method as defined in claim 3, further comprising, prior to forming the spacers, implanting ions at a low concentration into the silicon substrate to form lightly doped source/drain extension regions.

5. The method as defined in claim 4, farther comprising, prior to implanting the low concentration ions, growing a gate oxide on the silicon substrate, depositing a polysilicon layer on the gate oxide, and patterning the polysilicon layer to form the gate poly layer.

6. The method as defined in claim 1, further comprising forming a shallow trench isolation structure on, in or over the silicon substrate.

7. The method as defined in claim 1, wherein said gate poly layer has a width of about 0.13 µm or less.

8. The method as defined in claim 1, wherein depositing the selectivity poly comprises selective epitaxial growth of silicon.

9. The method as defined in claim 3, wherein the selectivity poly deposited on the gate poly layer covers a portion of the spacers.

10. The method as defined in claim 3, wherein the selectivity poly is deposited on the source/drain regions from the spacers to at least the shallow trench isolation structure.

11. The method as defined in claim 1, wherein the salicide comprises Ti/TiN on the selectivity poly.

12. The method as defined in claim 1, wherein the salicide comprises Co/Ti/TiN on the selectivity poly.

13. The method as defined in claim 5, wherein patterning the polysilicon layer comprises etching the gate poly layer and the gate oxide layer.

14. The method as defined in claim 1, wherein the salicide on the selectivity poly comprises titanium silicide.

15. The method as defined in claim 1, wherein the salicide on the selectivity poly comprises cobalt silicide.

16. The method as defined in claim 1, wherein forming the salicide comprises annealing a metal silicide.

17. The method as defined in claim 1, farther comprising forming a conductive baffler layer on the salicide after removing unsilicided metals.

18. The method as defined in claim 17, wherein the conductive barrier layer comprises a refractive metal nitride.

19. The method as defined in claim 18, wherein the conductive barrier layer further comprises an adhesive or glue layer between the conductive barrier layer and the metal silicide.

20. The method as defined in claim 1, farther comprising forming the gate poly layer on the substrate and forming the source/drain regions in the substrate prior to depositing the selectivity poly.

* * * * *